US006383240B1

(12) United States Patent
Nishimoto et al.

(10) Patent No.: US 6,383,240 B1
(45) Date of Patent: May 7, 2002

(54) AQUEOUS DISPERSION FOR CHEMICAL MECHANICAL POLISHING

(75) Inventors: Kazuo Nishimoto; Osamu Kikuchi; Nobuo Kawahashi, all of Tokyo (JP)

(73) Assignee: JSR Corporation, Tokyo (JP)

( * ) Notice: Subject to any disclaimer, the term of this patent is extended or adjusted under 35 U.S.C. 154(b) by 122 days.

(21) Appl. No.: 09/672,310

(22) Filed: Sep. 29, 2000

(30) Foreign Application Priority Data

Sep. 30, 1999 (JP) .......................................... 11-279335

(51) Int. Cl.$^7$ .............................. C09K 3/14; C09G 1/02; C09G 1/04
(52) U.S. Cl. .............................. 51/307; 51/308; 51/309; 106/3; 106/8; 438/692; 438/693
(58) Field of Search .......................... 51/307, 308, 309; 106/3, 8; 252/79.1; 438/692, 693

(56) References Cited

U.S. PATENT DOCUMENTS

| | | | | |
|---|---|---|---|---|
| 5,559,200 A | * | 9/1996 | Susuki et al. | 526/224 |
| 5,783,489 A | * | 7/1998 | Kaufaman et al. | 51/309 |
| 5,858,813 A | * | 1/1999 | Scherber et al. | 438/693 |
| 6,022,564 A | * | 2/2000 | Takechi et al. | 424/489 |
| 6,046,110 A | * | 4/2000 | Hirabayashi et al. | 438/693 |
| 6,123,933 A | * | 9/2000 | Hayama et al. | 424/69 |
| 6,126,514 A | * | 10/2000 | Muroyama | 106/3 |

FOREIGN PATENT DOCUMENTS

| | | |
|---|---|---|
| JP | 4-291722 | 10/1992 |
| JP | 4-291723 | 10/1992 |
| JP | 4-291724 | 10/1992 |
| JP | 5-32959 | 2/1993 |
| JP | 7-24740 | 1/1995 |
| JP | 8-197414 | 8/1996 |
| JP | 10-44047 | 2/1998 |
| JP | 10-270447 | 10/1998 |
| JP | 10-284596 | 10/1998 |
| JP | 11-21546 | 1/1999 |
| JP | 11-25614 | 1/1999 |
| JP | 11-256141 | 1/1999 |

\* cited by examiner

*Primary Examiner*—Michael Marcheschi
(74) *Attorney, Agent, or Firm*—Oblon, Spivak, McClelland, Maier & Neustadt, P.C.

(57) ABSTRACT

It is an object of the present invention to provide an aqueous dispersion for CMP that has low generation of coarse particles from abrasive particles or the like during storage or transport and maintains excellent polishing performance The aqueous dispersion for CMP according to the first aspect of the invention comprises abrasive particles, an amphipathic compound and water. The aqueous dispersion for CMP according to the second aspect of the invention comprising abrasive particles and water, wherein a boundary film is formed at the interface between the aqueous dispersion and the air. The boundary film may comprise an amphipathic compound. The HLB value of the amphipathic compound is preferably greater than 0 but no greater than 6. As amphipathic compounds there may be used one or more compounds selected from among [1] aliphatic alcohols, [2] fatty acids, [3] sorbitan fatty acid esters, [4] glycerin fatty acid esters, [5] propylene glycol fatty acid esters and [6] polyethylene glycol fatty acid esters.

26 Claims, No Drawings

AQUEOUS DISPERSION FOR CHEMICAL MECHANICAL POLISHING

BACKGROUND OF THE INVENTION

1. Field of the Invention

The present invention relates to an aqueous dispersion for chemical mechanical polishing. More specifically, the invention relates to an aqueous dispersion that is particularly useful for chemical mechanical polishing of working films of semiconductor devices and the like. The aqueous dispersion for chemical mechanical polishing of the invention has low generation of coarse solids during storage or transport, has less fear of causing scratches and the like, and maintains excellent polishing performance even after storage and transport.

2. Description of the Prior Art

With improved integration and multilayer wiring of semiconductor devices, the technique of chemical mechanical polishing (hereunder referred to as "CMP") is being introduced for polishing of working films and the like. This is a process whereby a wiring material such as tungsten, aluminum, copper or the like is embedded in a hole or groove formed in an insulating film on a processing wafer and then polishing is performed to remove the excess wiring material to thereby form the wiring. For such polishing, the abrasive particles used are usually inorganic particles of alumina, silica, zirconia or the like, or organic particles of polystyrene, polymethyl methacrylate or the like. Aqueous dispersions containing these abrasive particles can accomplish polishing of working films at sufficient rates.

Resinous or metallic sealed containers are commonly used for storage or transport of aqueous dispersions for CMP, but increasing temperature during storage can cause evaporation of moisture at the gas-liquid interface, which upon drying results in production of solids made of the abrasive particles. During transport, vibrations on the container can result in adhesion of the aqueous dispersion to the inner wall surface, with evaporation of moisture from the adhered aqueous dispersion leading to production of dried solids. These solids become included in the aqueous dispersion as coarse particles, and during polishing these coarse particles can cause scratching of polishing surfaces. They can also lead to clogging of conduits used for supply of the aqueous dispersion.

SUMMARY OF THE INVENTION

Problems to be Solved by the Invention

It is an object of the present invention to overcome the problems of the prior art described above, by providing an aqueous dispersion for CMP that has low generation of coarse particles from abrasive particles or the like during storage and transport, and maintains excellent polishing performance . In particular, it is an object to provide an aqueous dispersion for CMP that allows polishing of working films and the like of semiconductor devices at a sufficient rate and produces no scratches, even after storage and transport.

Features of the Invention

The aqueous dispersion for CMP according to the first aspect of the invention is characterized by comprising abrasive particles, an amphipathic compound and water.

The aqueous dispersion for CMP according to the second aspect of the invention is characterized by comprising abrasive particles and water, wherein a boundary film is formed at the interface between the aqueous dispersion and the air.

The boundary film according to the second aspect of the invention is composed of an amphipathic compound to inhibit escape of moisture, as according to the third aspect of the invention. That is, the aqueous dispersion for CMP according to the third aspect is characterized in that the boundary film of the second aspect of the invention is composed of an amphipathic compound. According to the second and third aspects of the invention, the "boundary film" formed at the interface between the aqueous dispersion and the air inhibits production of solids due to escape of moisture from the gas-liquid interface during storage or from the aqueous dispersion adhering to the upper inner wall surface due to vibrations on the container during transport.

The fourth aspect of the invention specifies the preferred range for the HLB value which represents the hydrophilic/lipophilic balance of the amphipathic compound, and it is characterized in that the HLB value is greater than 0 but no greater than 6.

Effect of the Invention

According to the first to third aspects of the invention, there is provided an aqueous dispersion for CMP that has low generation of coarse solids from abrasive particles and the like, maintains adequate polishing rate even after storage and transport, and produces no scratching. The aqueous dispersion is particularly useful for CMP of working films on semiconductor devices. Furthermore, by using specific amphipathic compounds as according to the fourth aspect, it is possible to produce aqueous dispersions for CMP that maintain even more stable polishing performance.

DETAILED DESCRIPTION OF THE INVENTION

The "abrasive particles" are not particularly restricted, and either inorganic particles or organic particles, or organic/inorganic composite particles, may be used.

As inorganic particles there may be mentioned silica, alumina, ceria, zirconia, titania and the like. For high purity, the inorganic particles are most preferably synthesized by a fumed process (high-temperature flame hydrolysis), a gas phase process by Nanophase Technology Corp. (metal vapor deposition oxidation) or a sol-gel process whereby synthesis is accomplished by hydrolyzing condensation from a metal alkoxide.

As organic particles there may be used polymer particles composed of a thermoplastic resin made of polystyrene and a styrene-based copolymer, or a (meth)acrylate resin such as polymethyl methacrylate and an acryl-based copolymer. There may also be used polymer particles composed of thermosetting resins such as phenol resin, urea resin, melamine resin, epoxy resin, alkyd resin or unsaturated polyester resin.

Polymer particles composed of a thermoplastic resin and polymer particles composed of a thermosetting resin may also be used in combination.

As organic/inorganic composite particles there may be mentioned composite particles which are organic particles evenly coated with inorganic particles, composite particles wherein a polymer is adhered or bonded to inorganic particles, or composite particles wherein a polymer film is formed on the surface of inorganic particles. Inorganic particles, organic particles and organic/inorganic composite particles may also be used in combination of two or more.

The content of the abrasive particles may be 0.05–20 parts by weight (hereunder referred to as "parts"), especially 0.07–15 parts and more preferably 0.1–10 parts, with respect to 100 parts of the aqueous dispersion, in terms of the total of the inorganic particles, organic particles and organic/inorganic composite particles. If the abrasive particle content is less than 0.05 part it may not be possible to achieve an aqueous dispersion with sufficient polishing performance. A content of greater than 20 parts is also not preferred as the cost is increased and the stability of the aqueous dispersion may be reduced.

The "amphipathic compound" is a compound having both a hydrophilic portion and a lipophilic portion in the molecule. The hydrophilic portion may be a hydroxyl group, ester group, carboxyl group or the like, and the lipophilic portion may be a relatively long-chained hydrocarbon group. As such compounds there may be mentioned (1) aliphatic alcohols, (2) fatty acids, (3) sorbitan fatty acid esters, (4) glycerin fatty acid esters, (5) propylene glycol fatty acid esters and (6) esters of polyethyleneglycol and fatty acids. The hydrocarbon groups of these compounds may have unsaturated bonds, and they may be linear or branched.

The following compounds may be mentioned as specific amphipathic compounds of the types listed above.

(1) Aliphatic alcohols: Monoalcohols of 6–18 carbons and polyols such as diols of 12–18 carbons and triols of 12–18 carbons are suitable for use. As specific examples there may be mentioned hexanol (HLB value: approx. 6), heptanol, octanol, decanol, dodecanol, tetradecanol (HLB value: approx. 1), hexadecanol, octadecanol and oleyl alcohol.

Preferred among these are monoalcohols of 12–18 carbons, of which tetradecanol, hexadecanol, octadecanol and oleyl alcohol are particularly preferred.

(2) Fatty acids: Fatty acids of 6–18 carbons are suitable for use. As specific examples there may be mentioned caprylic acid, capric acid, lauric acid, myristic acid, palmitic acid, stearic acid, oleic acid, linolic acid and linoleic acid.

Preferred among these are fatty acids of 12–18 carbons, of which stearic acid, oleic acid (HLB value: approx. 1), linolic acid and linoleic acid are particularly preferred.

(3) Sorbitan fatty acid esters: Esters of sorbitan and fatty acids of 12–18 carbons are suitable for use. As specific examples there may be mentioned sorbitan monostearate (HLB value: 4.7), sorbitan distearate (HLB value: 3.5), sorbitan tristearate (HLB value: 2.1), sorbitan tetrastearate (HLB value: 0.5), sorbitan monooleate (HLB value: 4.3), sorbitan dioleate, sorbitan trioleate (HLB value: 1.8) and sorbitan sesquioleate.

Sorbitan is used industrially in the form of mixtures of 1,4-sorbitan, 1,5-sorbitan and 1,4-sorbitan with further dehydration of one molecule. Sorbitan fatty acid esters are mono-, di-, tri- and tetraesters comprising these mixtures with higher fatty acids. Triesters such as sorbitan tristearate and sorbitan trioleate, and sorbitan tetrastearate, are particularly preferred, and usually mixtures of these various esters are used.

(4) Glycerin fatty acid esters: Esters of glycerin and fatty acids of 12–18 carbons are suitable for use. As specific examples there may be mentioned glycerol monostearate (HLB value: 3.8) and glycerol monooleate (HLB value: 2.8–3.5).

(5) Propylene glycol fatty acid esters: Esters of propylene glycol and fatty acids of 12–18 carbons are suitable for use. As specific examples there may be mentioned propylene glycol monostearate (HLB value: 3.4) and propylene glycol monolaurate (HLB value: 4.5).

Among these, propylene glycol monostearate is particularly preferred.

(6) Esters of polyethylene glycol and fatty acids: Monoesters and diesters of 12–18 carbons, and especially 15–18 carbons, with an average molecular weight of 50–500 and especially 100–300, are suitable for use. As specific examples there may be mentioned polyethylene glycol distearate (HLB value: 5.4) and polyethylene glycol dilaurate (HLB value: 2.7).

The esters of (3) to (6) above are formed by low carbon number alcohols and high carbon number acids, but there may also be used esters formed by high carbon number alcohols and low carbon number acids.

These amphipathic compounds may be used alone, or two or more of the compounds of (1) to (6), or two or more different types from among those of (1) to (6), may also be used in combination.

The content of the amphipathic compound may be 0.00001–10 parts, preferably 0.00005–5 parts, especially 0.0001–1 part and more preferably 0.0005–0.1 part, with respect to 100 parts of the aqueous dispersion.

The amphipathic compound may be directly added while stirring the aqueous dispersion, or it may be added after pre-dilution with water. In the case of an aliphatic alcohol or fatty acid, it may be emulsifying with a prescribed amount of water or with water and an emulsifying agent prior to its addition to the aqueous dispersion. For example, 60–80 parts of water and preferably 0.01–0.1 part of an anionic or nonionic surfactant may be combined with 20–40 parts of the amphipathic compound and stirred for emulsification, prior to its addition.

The HLB value is preferably greater than 0 but no greater than 6, especially 0.1–6, more preferably 0.3–5, and most preferably 0.5–4. The HLB value is preferably not greater than 6, because this may prevent formation of a boundary film capable of adequately inhibiting escape of moisture, thus resulting in production of solids upon drying.

The HLB value is the value determined based on the molecular structure or experimentally, and numerous equations have been proposed for determining the HLB value. For example, the following equation proposed by Griffin may be used for the calculation.

HLB value=(wt % of hydrophilic groups)/5

The aqueous dispersion for CMP according to the invention may be prepared by mixing the abrasive particles and amphipathic compound in water (ion-exchanged water or the like). The medium for the aqueous dispersion may be water or a mixed medium composed mostly of water, such as a mixture of water and methanol, but water alone is particularly preferred.

The aqueous dispersion may also contain an oxidizing agent. The oxidizing agent need only be water-soluble, and there are no particular restrictions on the type thereof. Specifically there may be mentioned hydrogen peroxide, organic peroxides such as peracetic acid, perbenzoic acid and tert-butylhydroperoxide, nitric acid compounds such as nitric acid and iron nitrate, perhalogenated compounds such as perchloric acid, transition metal salts such as potassium ferricyanide, persulfuric acid salts such as ammonium persulfate, and hetero polyacids. Including such oxidizing agents can provide improved polishing rate for polishing of working films and the like.

The content of the oxidizing agent may be 0.05–15 parts, especially 0.1–10 parts and more preferably 0.2–8 parts, with respect to 100 parts of the aqueous dispersion. If the content is less than 0.05 part the polishing rate of the aqueous dispersion will not be sufficiently increased. A content of 15 parts can adequately improve the polishing rate, and a greater amount exceeding 15 parts is not preferred since it can produce corrosion on the polishing surface and thus poses a risk for handling.

By adding an acid for pH adjustment, it is possible to further improve the dispersability, stability and polishing rate of the aqueous dispersion. The acid is not particularly restricted, and any organic acid or inorganic acid may be used. As organic acids there may be mentioned gluconic acid, lactic acid, citric acid, tartaric acid, malic acid, glycolic acid, malonic acid, formic acid, oxalic acid, succinic acid, fumaric acid, maleic acid and phthalic acid. These organic acids may be used alone or in combinations of two or more. As inorganic acids there may be mentioned nitric acid, hydrochloric acid and sulfuric acid, and these inorganic acids may also be used alone or in combinations of two or more. Combinations of organic acids and inorganic acids may also be used. These acids may be used at up to 10 parts, and especially from 0.001–8 parts to 100 parts of the aqueous dispersion. The acid content is preferably in the range of no greater than 10 parts as this will provide an aqueous dispersion with excellent dispersability and sufficient stability.

By adding a base for adjustment of the pH, it is possible to further improve the dispersability, corrosion resistance, stability and polishing rate of the aqueous dispersion. The base is not particularly restricted, and any organic base or inorganic base may be used. As organic bases there may be mentioned ethylenediamine, ethanolamine and 4-vinylpyridine. As inorganic bases there may be mentioned ammonia, potassium hydroxide, sodium hydroxide and lithium hydroxide. These bases may be used alone or in combinations of two or more. The bases may be used at up to 10 parts, and especially from 0.001–8 parts to 100 parts of the aqueous dispersion. The base content is preferably in the range of no greater than 10 parts as this will provide an aqueous dispersion with excellent dispersability and sufficient stability.

Aqueous dispersions according to the first to third aspects of the invention are particularly useful for CMP of working films on semiconductor devices. As working films there may be mentioned silicon oxide films, amorphous silicon films, polycrystalline silicon films, single-crystal silicon films, silicon nitride films, pure tungsten films, pure aluminum films or pure copper films, as well as alloy films of tungsten, aluminum and/or copper with another metals, that are formed on semiconductor substrates in manufacturing processes for semiconductor devices such as VLSIs and the like. Barrier metal layers composed of metals such as tantalum and titanium or oxides or nitrides thereof, may also be mentioned as working films.

The CMP of a working film or the like on a semiconductor device with an aqueous dispersion may be accomplished using a commercially available CMP apparatus (such as Model "LGP510" or "LGP552" by Lapmaster SFT Corp., a Model "EPO-112" or "EPO-222" by Ebara Laboratories Co., Ltd., or a Model "Mirra" by Applied Materials Corp.). After the polishing, it is preferred to remove the residual abrasive particles from the polishing surface. The particle removal can be accomplished by a common washing method, and in the case where the abrasive particles are organic particles, the polishing surface can be heated at high temperature in the presence of oxygen to burn the particles for their removal. As the method for burning there may be mentioned exposure to oxygen plasma, or ashing treatment with plasma whereby oxygen radicals are supplied in a downflow; these allow the residual organic particles to be easily removed from the polishing surface.

Embodiments of the Invention

The present invention will now be explained in greater detail by way of examples.

(1) Production of Aqueous Dispersion Containing Abrasive Particles

PRODUCTION EXAMPLE 1

Production of Aqueous Dispersion Containing Silica Particles 20 kg of fumed silica (product name "Aerosil #50", by Nippon Aerosil Co., Ltd.) was continuously added over a period of 30 minutes to 27 kg of distilled water in a planetary-type kneader (Model "TK Hibis Dispermix HDM-3D-20", product of Tokushu Kika Kogyo Co., Ltd.) having the liquid-contacting sections of the stirrer and container coated with a urethane resin, while kneading by rotation of a twisting blade at 18 rpm for the main rotating axis and 36 rpm for the secondary rotation axis. This was followed by one hour of simultaneously performing a kneading procedure with a total solid content of 43%, whereby the twisting blade was rotated at a secondary rotation axis speed of 54 rpm, and dispersion treatment whereby an 80-mm diameter Cores high-speed rotating blade was rotated at a secondary rotation axis speed of 2700 rpm, with a main rotation axis speed of 10 rpm for both.

The resulting slurry was diluted with ion-exchanged water to obtain an aqueous colloid containing silica at a total solid content of 30%. This was then treated with a depth cartridge filter with a pore size of 1 $\mu$m to remove the coarse particles. The mean particle size of the particles of silica in the aqueous dispersion (abrasive particle dispersion) was 0.24 $\mu$m.

PRODUCTION EXAMPLE 2

Production of Aqueous Dispersion Containing Alumina Particles

An aqueous dispersion with a 30% total solid content was obtained in the same manner as Production Example 1, except that 17 kg of fumed alumina (trade name "Aluminum Oxide C", product of Degusa Corp.) was used instead of fumed silica. The mean particle size of the alumina in the abrasive particle dispersion was 0.18 μm.

(2) Preparation of Aqueous Dispersion for CMP Examples 1–4 and Comparative Examples 1–3

For Examples 1–4, prescribed amounts of amphipathic compounds were added to prepare aqueous dispersions for CMP having the compositions shown in Table 1. The details regarding the amphipathic compounds were as follows.

Sorbitan trioleate: Nonionic surfactant (product name: "Leodol SP-030" by Kao Co., Ltd.); HLB value: 1.8

Oleic acid emulsion: Emulsion prepared by adding 70 parts of ion-exchanged water and 0.1 part of ammonium lauryl sulfate (product name: "Latemur AD25" by Kao Co., Ltd.) to 30 parts of oleic acid and stirring for emulsification; HLB value: 1.4

Hexadecanol: HLB value: 1.0

For Comparative Examples 1–3, aqueous dispersions for CMP were prepared having the compositions shown in Table 1 without addition of amphipathic compounds. The ethylene glycol used for Comparative Example 2 was a hydrophilic compound, and its HLB value was approximately 10.

The "parts" for the abrasive particle dispersions listed in Table 1 are all values based on a total solid content of 30%.

(3) Performance Evaluation of Aqueous Dispersions

[1] Drying Property and Solid Production Property

Drying property test: After dropping 0.1 milliliter of the aqueous dispersion on the surface of a glass plate, the time required to reach complete dryness at 23° C. was measured.

Solid production test: After loading 1.8 kg of the aqueous dispersion in a 2-liter polyethylene bottle, sealing it and keeping it at 40° C. for 48 hours (shaking the bottle for one minute at 12, 24, 36 and 48 hours), a 300-mesh wire gauze was used for filtration to dryness, and the amount (g) of solids on the wire gauze was determined by comparison with the weight of the wire gauze before filtration.

[2] Tungsten Film Polishing Test

Of the aqueous dispersions prepared in (2) above, the aqueous dispersions of Examples 1–3 and Comparative Examples 1 and 2 were used for a tungsten film polishing test. Specifically, an 8-inch tungsten wiring-patterned wafer (product name: "SKW-5" by SKW Associates Corp., film thickness: 15,000 Å) was set in a CMP apparatus (Model "LGP-510" by Lapmaster SFT Corp.) on which a porous polyurethane polishing pad (product name: "IC1000" by Rodel-Nitta Corp.) had been mounted, and polishing was carried out with a load at 250 g/cm$^2$. The urethane pad surface was subjected to 3 minutes of rotary polishing at a disk rotation rate of 30 rpm while supplying the aqueous dispersion at a rate of 200 cc/min. The (a) polishing rate and (b) presence of any scratches were evaluated according to the following methods.

(a) Polishing Rate

The residual film thickness was determined from a calibration curve prepared based on the sheet resistance measured with a resistivity meter (Sigma 5 type, product of NSP Corp.) by the 4-point needle method, and calculation was performed using the following equation.

Polishing rate (Å/min)=(film thickness before polishing−residual film thickness)/polishing time (b) Presence of Scratches The presence of scratches on the polishing surface after polishing was evaluated with a contact needle surface roughness tester (Model "KLA2112" by KLA Tencor Corp.).

[31] Copper Film Polishing Test

Of the aqueous dispersions prepared in (2) above, the aqueous dispersions of Example 4 and Comparative Example 3 were used for a copper film polishing test. Specifically, an 8-inch copper wiring-patterned wafer (film thickness: 15,000 Å) was set in a CMP apparatus (Model "LGP-510" by Lapmaster SFT Corp.) on which a porous polyurethane polishing pad (product name: "IC1000" by Rodel-Nitta Corp.) had been mounted, and polishing was carried out with a load at 300 g/cm$^2$. The urethane pad surface was subjected to 3 minutes of rotary polishing at a disk rotation rate of 50 rpm while supplying the aqueous dispersion at a rate of 100 cc/min. The (a) polishing rate and (b) presence of any scratches were evaluated in the same manner as the polishing test of [2] above.

TABLE 1

|  | Examples | | | | Comparative Example | | |
|---|---|---|---|---|---|---|---|
|  | 1 | 2 | 3 | 4 | 1 | 2 | 3 |
| Composition |  |  |  |  |  |  |  |
| Ion-exchanged water (parts) |  | 733 |  | 894 |  | 733 | 894 |
| Abrasive particle dispersion (particle type/parts) |  | silica/167 |  | alumina/167 | alumina/100 |  | silica/167 | alumina/100 |
| 20% aqueous iron (II) nitrate solution (parts) |  | 100 |  |  |  | 100 |  |
| 4-vinylpyridine (parts) |  |  |  |  | 3 |  | 3 |
| Ammonium persulfate (parts) |  |  |  |  | 3 |  | 3 |
| Amphipathic compound |  |  |  |  |  |  |  |
| Type | sorbitan trioleate | oleic acid emulsion | hexadecanol | hexadecanol |  | (ethylene glycol) |  |
| Content (parts) | 0.001 | 0.05 | 0.01 | 0.005 |  | 15 |  |

TABLE 1-continued

|  | Examples | | | | Comparative Example | | |
| --- | --- | --- | --- | --- | --- | --- | --- |
|  | 1 | 2 | 3 | 4 | 1 | 2 | 3 |
| Drying time (min) | 390 | 450 | 600 | 520 | 95 | 150 | 170 |
| Solid weight (g) | 0.0005 | 0.0006 | 0.0004 | 0.0003 | 5 | 3 | 0.2 |
| Polishing test before solid production test | | | | | | | |
| Polishing rate (Å/min) | 1700 | 1500 | 3100 | 3250 | 1650 | 500 | 3300 |
| Presence of scratches | | | none | | | none | |
| Polishing test after solid production test | | | | | | | |
| Polishing rate (Å/min) | 1720 | 1530 | 3050 | 3200 | 1500 | 450 | 3200 |
| Presence of scratches | | | none | | | | scraches |

The polishing tests of [2] and [3] were carried out with the aqueous dispersions before and after the solid production test of [1] above.

Table 1 gives the results of evaluating the drying time, amount of solids produced, the polishing rate and the presence of scratches.

According to the results in Table 1, the aqueous dispersions of Examples 1–4 that contained 0.001–0.01 part of the specific amphipathic compounds had drying times of 390 minutes or longer, and virtually no solids were produced. There was also almost no change in the polishing rate before and after the solid production test, and no scratches were produced. On the other hand, in Comparative Examples 1 and 3 that contained no amphipathic compound, the time required for drying was shorter, many solids were observed, and although there was no major change in the polishing rate before and after the solid production test, scratches were found upon using the aqueous dispersions after the solid production test, which were not present when the aqueous dispersion was used prior to the solid production test. Also, in Comparative Example 2 which contained a large amount of ethylene glycol had a longer but still insufficient drying time compared to Comparative Example 1, many solids were observed and the polishing rate was greatly reduced. Scratches were also produced when the aqueous dispersion was used after the solid production test.

What is claimed is:

1. An aqueous dispersion for chemical mechanical polishing comprising abrasive particles, an amphipathic compound and water; wherein
said amphipathic compound is one or more compounds selected from:
aliphatic alcohols;
sorbitan fatty acid esters;
glycerin fatty acid esters;
propylene glycol fatty acid esters; and
wherein said amphipathic compound is present in an amount of 0.0001–1 part by weight per 100 parts by weight of said aqueous dispersion; and
wherein said abrasive particles are present in an amount of 0.05–20 parts by weight per 100 parts by weight of said aqueous dispersion.

2. An aqueous dispersion for chemical mechanical polishing according to claim 1, wherein an HLB value which represents a hydrophilic/lipophilic balance of said amphipathic compound is greater than 0 but no greater than 6.

3. An aqueous dispersion for chemical mechanical polishing comprising abrasive particles and water, wherein a boundary film is formed at an interface between said aqueous dispersion and air; wherein said boundary film comprises an amphipathic compound; wherein
said amphipathic compound is one or more compounds selected from:
aliphatic alcohols;
sorbitan fatty acid esters;
glycerin fatty acid esters;
propylene glycol fatty acid esters; and
wherein said amphipathic compound is present in an amount of 0.0001–1 part by weight per 100 parts by weight of said aqueous dispersion; and
wherein said abrasive particles are present in an amount of 0.05–20 parts by weight per 100 parts by weight of said aqueous dispersion.

4. An aqueous dispersion for chemical mechanical polishing according to claim 3, wherein an HLB value which represents a hydrophilic/lipophilic balance of said amphipathic compound is greater than 0 but no greater than 6.

5. The aqueous dispersion according to claim 1, wherein said abrasive particles are present in an amount of 0.07–15 parts by weight per 100 parts by weight of said aqueous dispersion.

6. The aqueous dispersion according to claim 3, wherein said abrasive particles are present in an amount of 0.07–15 parts by weight per 100 parts by weight of said aqueous dispersion.

7. The aqueous dispersion according to claim 1, wherein said abrasive particles are present in an amount of 0.1–10 parts by weight per 100 parts by weight of said aqueous dispersion.

8. The aqueous dispersion according to claim 3, wherein said abrasive particles are present in an amount of 0.1–10 parts by weight per 100 parts by weight of said aqueous dispersion.

9. The aqueous dispersion according to claim 1, wherein said amphipathic compound is present in an amount of 0.0005–0.1 parts by weight per 100 parts by weight of said aqueous dispersion.

10. The aqueous dispersion according to claim 3, wherein said amphipathic compound is present in an amount of 0.0005–0.1 parts by weight per 100 parts by weight of said aqueous dispersion.

11. The aqueous dispersion according to claim 1, wherein said amphipathic compound has an HLB value of 0.1–6.

12. The aqueous dispersion according to claim 3, wherein said amphipathic compound has an HLB value of 0.1–6.

13. The aqueous dispersion according to claim 1, wherein said amphipathic compound has an HLB value of 0.3–5.

14. The aqueous dispersion according to claim 3, wherein said amphipathic compound has an HLB value of 0.3–5.

15. The aqueous dispersion according to claim 1, further comprising an oxidizing agent in an amount of 0.05–15 parts by weight per 100 parts by weight of said aqueous dispersion and selected from the group consisting of hydrogen peroxide, peracetic acid, perbenzoic acid, tert-butylhydroperoxide, nitric acid, iron nitrate, perchloric acid, potassium ferricyanide, ammonium persulfate and hetero polyacids.

16. The aqueous dispersion according to claim 3, further comprising an oxidizing agent in an amount of 0.05–15 parts by weight per 100 parts by weight of said aqueous dispersion and selected from the group consisting of hydrogen peroxide, peracetic acid, perbenzoic acid, tert-butylhydro peroxide, nitric acid, iron nitrate, perchloric acid, potassium ferricyanide, ammonium persulfate and hetero polyacids.

17. The aqueous dispersion according to claim 1, wherein said aqueous dispersion comprises a medium selected from the group consisting of water and a mixture of water and methanol.

18. The aqueous dispersion according to claim 3, wherein said aqueous dispersion comprises a medium selected from the group consisting of water and a mixture of water and methanol.

19. The aqueous dispersion according to claim 1, wherein said sorbitan fatty acid esters are selected from the group consisting of sorbitan monostearate, sorbitan distearate, sorbitan tristearate, sorbitan tetrastearate, sorbitan monooleate, sorbitan dioleate, sorbitan trioleate, sorbitan sesquioleate, and mixtures thereof.

20. The aqueous dispersion according to claim 3, wherein said sorbitan fatty acid esters are selected from the group consisting of sorbitan monostearate, sorbitan distearate, sorbitan tristearate, sorbitan tetastearate, sorbitan monooleate, sorbitan dioleate, sorbitan trioleate, sorbitan sesquioleate, and mixtures thereof.

21. The aqueous dispersion according to claim 1, wherein said glycerin fatty acid esters are selected from the group consisting of glycerol monostearate, glycerol monooleate, and mixtures thereof.

22. The aqueous dispersion according to claim 3, wherein said glycerin fatty acid esters are selected from the group consisting of glycerol monostearate, glycerol monooleate, and mixtures thereof.

23. The aqueous dispersion according to claim 1, wherein said propylene glycol fatty acid esters are selected from the group consisting of propylene glycol monostearate, propylene glycol monolaurate, and mixtures thereof.

24. The aqueous dispersion according to claim 3, wherein said propylene glycol fatty acid esters are selected from the group consisting of propylene glycol monostearate, propylene glycol monolaurate, and mixtures thereof.

25. The aqueous dispersion according to claim 1, wherein said aliphatic alcohols are selected from the group consisting of hexanol, heptanol, octanol, decanol, dodecanol, tetradecanol, hexadecanol, octadecanol, oleyl alcohol, and mixtures thereof.

26. The aqueous dispersion according to claim 3, wherein said aliphatic alcohols are selected from the group consisting of hexanol, heptanol, octanol, decanol, dodecanol, tetradecanol,. hexadecanol, octadecanol, oleyl alcohol, and mixtures thereof.

\* \* \* \* \*